(12) United States Patent
Baik et al.

(10) Patent No.: US 9,082,579 B2
(45) Date of Patent: Jul. 14, 2015

(54) ELECTROMAGNETIC WAVE OSCILLATOR HAVING MULTI-TUNNEL AND ELECTROMAGNETIC WAVE GENERATING APPARATUS INCLUDING THE ELECTROMAGNETIC WAVE OSCILLATOR

(75) Inventors: Chan-wook Baik, Yongin-si (KR); Ho-young Ahn, Suwon-si (KR); Yong-sung Kim, Namyangju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 67 days.

(21) Appl. No.: 13/560,541

(22) Filed: Jul. 27, 2012

(65) Prior Publication Data

US 2013/0200789 A1 Aug. 8, 2013

(30) Foreign Application Priority Data

Feb. 7, 2012 (KR) ........................ 10-2012-0012533

(51) Int. Cl.
*H01J 25/34* (2006.01)
*H01J 25/48* (2006.01)
*B81C 1/00* (2006.01)

(52) U.S. Cl.
CPC ............. *H01J 25/34* (2013.01); *B81C 1/00063* (2013.01); *B81C 1/00619* (2013.01); *H01J 25/48* (2013.01); *B81B 2201/0271* (2013.01); *B81C 2201/019* (2013.01)

(58) Field of Classification Search
USPC ............................................... 315/39.2, 39.3
See application file for complete search history.

(56) References Cited

U.S. PATENT DOCUMENTS

| | | | | |
|---|---|---|---|---|
| 2,848,649 A * | 8/1958 | Bryant | ........................... | 315/39 |
| 3,237,047 A * | 2/1966 | Webster | ...................... | 315/5.29 |
| 3,305,749 A * | 2/1967 | Hogg | .............................. | 315/3.6 |
| 3,325,669 A * | 6/1967 | Biguenet | ....................... | 315/3.5 |
| 3,383,543 A * | 5/1968 | Harper et al. | ..................... | 315/3.5 |
| 3,778,717 A * | 12/1973 | Okoshi et al. | ................. | 455/129 |
| 4,149,107 A | 4/1979 | Guenard | | |
| 4,263,566 A | 4/1981 | Guenard | | |
| 4,399,389 A * | 8/1983 | Fleury et al. | ................... | 315/3.5 |
| 4,409,519 A * | 10/1983 | Karp | ............................. | 315/3.5 |

(Continued)

FOREIGN PATENT DOCUMENTS

| | | |
|---|---|---|
| JP | 2006-210585 A | 8/2006 |
| KR | 10-2010-0132237 B1 | 12/2010 |
| KR | 10-2011-0079222 A | 7/2011 |

OTHER PUBLICATIONS

Communication, dated Apr. 29, 2013, issued by the European Patent Office in counterpart European Patent Application No. 12188218.7.

*Primary Examiner* — Douglas W Owens
*Assistant Examiner* — Srinivas Sathiraju
(74) *Attorney, Agent, or Firm* — Sughrue Mion, PLLC

(57) ABSTRACT

Electromagnetic wave oscillators each having a multi-tunnel and electromagnetic wave generating apparatuses including the electromagnetic wave oscillators are provided. The electromagnetic wave oscillator includes: a first waveguide which has a folded structure such that a path traveled by an electromagnetic wave through the first waveguide crosses an axial direction a plurality of times; an electron beam tunnel through which an electron beam passes, wherein the electron beam tunnel extends along the axial direction and crosses the first waveguide a plurality of times; and at least one auxiliary tunnel which extends parallel to the electron beam tunnel and which crosses the first waveguide a plurality of times.

26 Claims, 12 Drawing Sheets

(56) References Cited

U.S. PATENT DOCUMENTS

| | | | |
|---|---|---|---|
| 4,431,944 A * | 2/1984 | Deville et al. | 315/3.6 |
| 4,567,401 A * | 1/1986 | Barnett et al. | 315/5 |
| 4,727,550 A | 2/1988 | Chang et al. | |
| 5,790,585 A | 8/1998 | Walsh | |
| 8,476,830 B2 * | 7/2013 | Hwu et al. | 315/39 |
| 2005/0077973 A1 | 4/2005 | Dayton, Jr. | |
| 2006/0268945 A1 * | 11/2006 | Minamide et al. | 372/6 |

* cited by examiner

ELECTROMAGNETIC WAVE OSCILLATOR HAVING MULTI-TUNNEL AND ELECTROMAGNETIC WAVE GENERATING APPARATUS INCLUDING THE ELECTROMAGNETIC WAVE OSCILLATOR

CROSS-REFERENCE TO RELATED APPLICATION

This application claims priority from Korean Patent Application No. 10-2012-0012533, filed on Feb. 7, 2012, in the Korean Intellectual Property Office, the disclosure of which is incorporated herein in its entirety by reference.

BACKGROUND

1. Field

Apparatuses consistent with exemplary embodiments relate to electromagnetic wave oscillators each having a multi-tunnel and electromagnetic wave generating apparatuses including the electromagnetic wave oscillators, and more particularly, to electromagnetic wave oscillators for oscillating an electromagnetic wave in a terahertz band and electromagnetic wave generating apparatuses including the electromagnetic wave oscillators.

2. Description of the Related Art

A frequency band of terahertz ($10^{12}$ Hz) between a microwave frequency band and an optical frequency band is expected to be a frequency band that is very significant in the fields of molecular optics, biophysics, medicine, spectroscopy, imaging, security, and the like. However, despite the significance of the terahertz band, the development of terahertz oscillators or amplifiers that generate terahertz waves is not sufficient due to physical and engineering limitations. As several new theories and a micro-processing technology have been developed, the development of terahertz oscillators or amplifiers has been recently attempted.

For example, several approaches, such as increasing frequencies of several oscillators in an existing micro-wave band, or changing an operational frequency into a terahertz band by using an optical device, such as a semiconductor laser or a femtosecond laser have been tried. In addition, a variety of schemes for making small-size terahertz oscillators by using a three-dimensional (3D) micro-structure manufactured using micro electro mechanical system (MEMS) technology have been recently suggested.

Backward wave oscillators are an example of terahertz oscillators using MEMS technology. A backward wave oscillator is a kind of interaction circuit that forms an electron beam path in a cavity for resonating an electromagnetic wave in order to oscillate a terahertz wave by interacting an electron beam emitted from an electron gun with the electromagnetic wave. A mechanism for converting energy of the electron beam to electromagnetic wave energy by interaction between the electron beam and the electromagnetic wave is significant in the terahertz interaction circuit.

SUMMARY

One or more exemplary embodiments may provide electromagnetic oscillators for oscillating electromagnetic waves in a terahertz band and electromagnetic wave generating apparatuses including the electromagnetic wave oscillators.

Additional aspects of exemplary embodiments will be set forth in part in the description which follows and, in part, will be apparent from the description, or may be learned by practice of the presented embodiments.

According to an aspect of an exemplary embodiment, an electromagnetic wave oscillator includes: a first waveguide which has a folded structure such that a path traveled by an electromagnetic wave through the first waveguide crosses an axial direction a plurality of times; an electron beam tunnel through which an electron beam passes, wherein the electron beam tunnel extends along the axial direction and crosses the first waveguide a plurality of times; and at least one auxiliary tunnel which extends parallel to the electron beam tunnel and which crosses the first waveguide a plurality of times.

The at least one auxiliary tunnel may be disposed one of above and below the electron beam tunnel.

The at least one auxiliary tunnel may be disposed one of at a left side and a right side of the electron beam tunnel.

The at least one auxiliary tunnel may be disposed one of above and below the electron beam tunnel and one of at a left side and a right side of the electron beam tunnel.

The at least one auxiliary tunnel may include at least two auxiliary tunnels disposed one of above and below the electron beam tunnel and the at least two auxiliary tunnels may be adjacent to each other at the same height.

The at least one auxiliary tunnel may include at least two auxiliary tunnels disposed one of at a left side and a right side of the electron beam tunnel and the at least two auxiliary tunnels may be adjacent to each other at different heights.

The folded structure of the first waveguide may include a plurality of coupled cavities disposed at left and right sides of the electron beam tunnel.

The at least one auxiliary tunnel may be disposed between a left side of the electron beam tunnel and a plurality of the coupled cavities disposed to the left of the electron beam tunnel. The at least one auxiliary tunnel may be disposed between a right side of the electron beam tunnel and a plurality of the coupled cavities disposed to the right of the electron beam tunnel.

The at least one auxiliary tunnel may be disposed one of above and below the electron beam tunnel, and the at least one auxiliary tunnel may be disposed one of between a left side of the electron beam tunnel and a plurality of the coupled cavities disposed to the left of the electron beam tunnel and between a right side of the electron beam tunnel and a plurality of the coupled cavities disposed to the right of the electron beam tunnel.

The at least one auxiliary tunnel may include at least two auxiliary tunnels disposed between a left side of the electron beam tunnel and a plurality of the coupled cavities disposed to the left of the electron bean tunnel or disposed between a right side of the electron beam tunnel and a plurality of the coupled cavities disposed to the right of the electron beam tunnel, and the at least two auxiliary tunnels may be adjacent to each other at different heights.

The electromagnetic wave oscillator may further include: a second waveguide including a first end connected to the first waveguide and a second end including an electromagnetic wave output port; an electron beam input port which is connected to the first end of the electron beam tunnel and on which the electron beam is incident; and an electron beam discharge port which is connected to the second end of the electron beam tunnel and from which the electron beam is discharged.

The second waveguide may include a bend of about 90 degrees and may have a tapered structure in which a width of the second waveguide increases from the first end to the second end thereof.

The electromagnetic wave oscillator may further include: a lower structure having an upper surface; and an upper structure having a lower surface bonded to the upper surface of the lower structure, wherein the first waveguide and the electron beam tunnel are formed between over the upper surface of the lower structure and the lower surface of the upper structure, and the at least one auxiliary tunnel is disposed in at least one of the lower structure and the upper structure.

The lower structure may include: a first substrate including a first hole which does not extend entirely through the first substrate and a second hole which does not extend entirely through the first substrate, wherein the second hole is disposed one of at a left side of the first hole and at a right side of the first hole; and a second substrate including a first hole which does not extend entirely through the second substrate and a second hole which extends entirely through the second substrate, wherein the second hole of the second substrate is formed in a position corresponding to a position of the second hole of the first substrate.

The upper structure may include: a third substrate including a first hole which does not extend entirely through the third substrate and a second hole which does not extend entirely through the third substrate, wherein the second hole is disposed one of at at a left side of the first hole and at a right side of the first hole; and a fourth substrate including a first hole which does not extend entirely through the fourth substrate and a second hole which extends entirely through the fourth substrate, wherein the second hole of the fourth substrate is formed in a position corresponding to a position of the second hole of the third substrate.

The second substrate and the fourth substrate may be bonded to each other, and the electron beam tunnel may be formed by the first hole of the second substrate and the first hole of the fourth substrate.

The first waveguide may be formed by the second hole of the first substrate, the second hole of the second substrate, the second hole of the fourth substrate, and the second hole of the third substrate.

The at least one auxiliary tunnel may include an auxiliary tunnel formed by the first hole of the first substrate and an auxiliary tunnel formed by the first hole of the third substrate.

The lower structure may further include a fifth substrate interposed between the first substrate and the second substrate and including a first hole which does not extend entirely through the fifth substrate and a second hole which extends entirely through the fifth substrate, wherein the second hole is disposed one of at a left side of the first hole and at a right side of the first hole.

The upper structure may further include a sixth substrate interposed between the third substrate and the fourth substrate and including a first hole which does not extend entirely through the sixth substrate and a second hole which extends entirely through the sixth substrate, wherein the second hole is disposed one of at a left side of the first hole and at a right side of the first hole.

The at least one auxiliary tunnel may include an auxiliary tunnel formed by the first hole of the fifth substrate and an auxiliary tunnel formed by the first hole of the sixth substrate.

The electromagnetic wave oscillator may further include a metal thin layer coated on the first substrate, the second substrate, the third substrate, the fourth substrate, the fifth substrate and the sixth substrate.

According to an aspect of another exemplary embodiment, an electromagnetic wave generating apparatus includes: an electromagnetic wave oscillator having the above structure; an electron gun which supplies an electron beam to the electromagnetic wave oscillator; and a collector which collects the electron beam discharged from the electromagnetic wave oscillator.

The electromagnetic wave oscillator may be configured to cause one of a millimeter wave, a sub-millimeter wave, and an electromagnetic wave in a terahertz frequency band passing through the first waveguide to obtain energy by interaction with the electron beam that passes through the electron beam tunnel.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
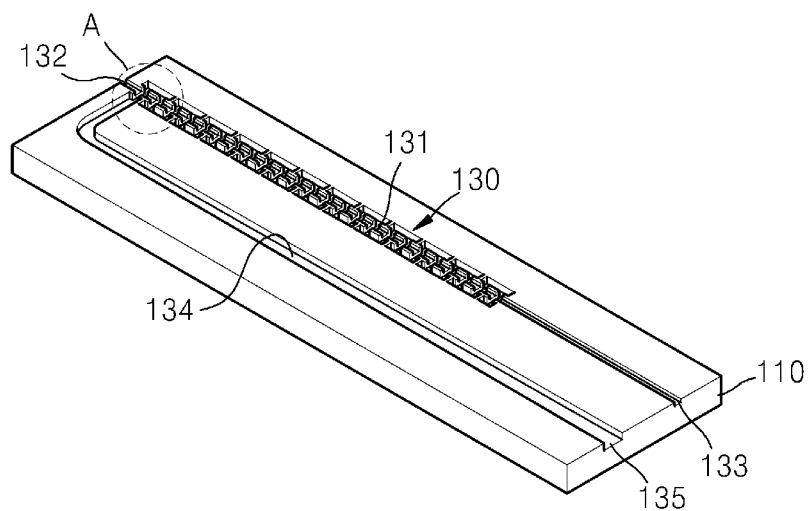
FIG. 1 is a schematic perspective view of a lower structure of an electromagnetic wave oscillator according to an exemplary embodiment.

Hereinafter, exemplary embodiments will be described more fully with reference to the accompanying drawings.

Like reference numerals in the drawings refer to like elements throughout, and sizes of elements in the drawings may be exaggerated for clarity and convenience.

FIG. 1 is a schematic perspective view of a lower structure 110 of an electromagnetic wave oscillator according to an exemplary embodiment. Referring to FIG. 1, a first waveguide 130 functions as a path in which an electromagnetic wave, for example, in a terahertz band is generated, and in which the electromagnetic wave travels. A second waveguide 134 is connected to the first waveguide 130 and outputs an electromagnetic wave, and an electron beam tunnel 131 is arranged in an axial direction to perforate the first waveguide 130 and functions as an electron beam proceeding path. The first waveguide 130, the second waveguide 134, and the electron beam tunnel 131 may be formed on a surface of the lower structure 110 of the electromagnetic wave oscillator.

In addition, as illustrated in FIG. 1, an electron beam input port 132 formed to perforate one side of the lower structure 110 so as to be connected to one end of the electron beam tunnel 131, and an electron beam discharge port 133 formed to perforate the other side of the lower structure 110 so as to be connected to the other end of the electron beam tunnel 131, may be formed on the surface of the lower structure 110. Thus, an electron beam is incident on the electromagnetic wave oscillator via the electron beam input port 132 and then passes through the electron beam tunnel 131 and interacts with an electromagnetic wave, and after the interaction, a remaining electron beam may be discharged from the electron beam discharge port 133. An electromagnetic wave output port 135 is formed to perforate the side of the lower structure 110 so that the generated electromagnetic wave may be output, and may be formed on an end of the second waveguide 134. The second waveguide 134 may be bent at 90 degrees in a portion where the second waveguide 134 is connected to the first waveguide 130, for example. In addition, the second waveguide 134 may have a tapered structure in which a width of the second waveguide 134 increases as it gets closer to the electromagnetic wave output port 135. However, the structure of the second waveguide 134 of FIG. 1 is just an example, and the second waveguide 134 having another structure may be designed as occasion demands.

Figure 2:
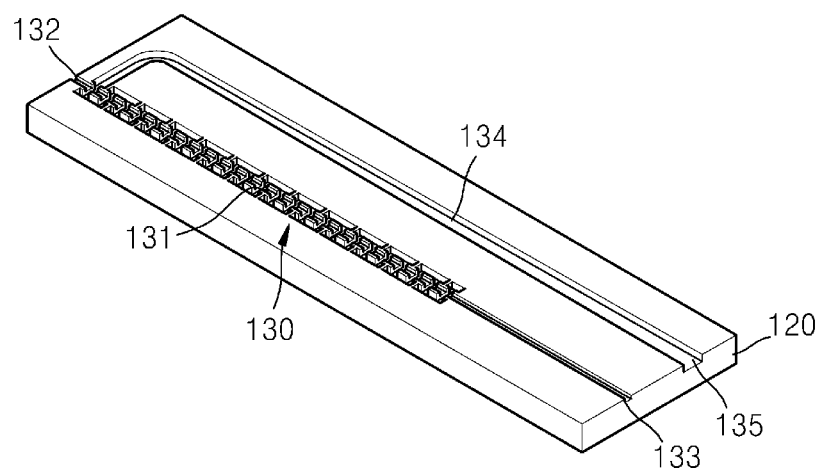
FIG. 2 is a schematic perspective view of an upper structure of an electromagnetic wave oscillator according to an exemplary embodiment.

FIG. 2 is a schematic perspective view of an upper structure 120 of an electromagnetic wave oscillator according to an exemplary embodiment. Referring to FIG. 2, similar to the lower structure 110 of FIG. 1, a first waveguide 130, a second waveguide 134, an electron beam tunnel 131, an electron beam input port 132, an electron beam discharge port 133, and an electromagnetic wave output port 135 may be formed on a surface of the upper structure 120 of the electromagnetic wave oscillator. The structure of the upper structure 120 is substantially the same as that of the lower structure 110, and the only difference is a mirror symmetry relationship between the upper structure 120 and the lower structure 110. Thus, when the upper structure 120 of FIG. 2 is overlaid on the lower structure 110 of FIG. 1 and is bonded onto the lower structure 110 of FIG. 1, the first waveguide 130, the second waveguide 134, the electron beam tunnel 131, the electron beam input port 132, the electron beam discharge port 133, and the electromagnetic output port 135 formed on the surface of the lower structure 110 may be exactly matched to the first waveguide 130, the second waveguide 134, the electron beam tunnel 131, the electron beam input port 132, the electron beam discharge port 133, and the electromagnetic wave output port 135 formed on the upper structure 120.

By bonding the upper structure 120 onto the lower structure 110 in this manner, the first waveguide 130, the second waveguide 134, the electron beam tunnel 131, the electron beam input port 132, the electron beam discharge port 133, and the electromagnetic wave output port 135, respectively, may be completed. In this regard, the first waveguide 130, the second waveguide 134, the electron beam tunnel 131, the electron beam input port 132, the electron beam discharge port 133, and the electromagnetic wave output port 135 may be formed over the surface of the lower structure 110 and the surface of the upper structure 120 to be bonded onto the lower structure 110. By bonding the upper structure 120 onto the lower structure 110, one electromagnetic wave oscillator including the first waveguide 130, the second waveguide 134, the electron beam tunnel 131, the electron beam input port 132, the electron beam discharge port 133, and the electromagnetic wave output port 135 may be completed.

Figure 3:
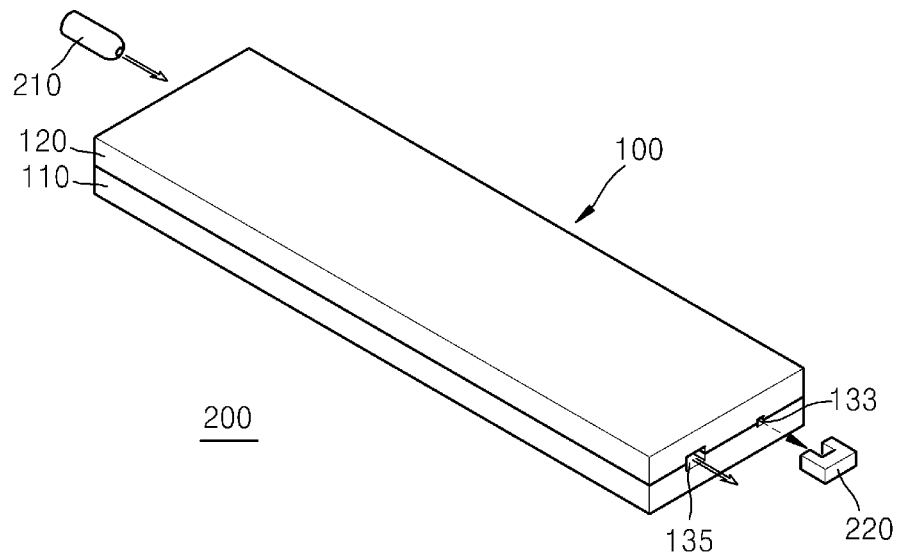
FIG. 3 is a schematic perspective view of an electromagnetic wave oscillator manufactured by combining the lower structure of FIG. 1 and the upper structure of FIG. 2, according to an exemplary embodiment, and an electromagnetic generating apparatus including the electromagnetic wave oscillator.

FIG. 3 is a schematic perspective view of an electromagnetic wave oscillator 100 manufactured by combining the lower structure 110 of FIG. 1 and the upper structure 120 of FIG. 2, and of an electromagnetic wave generating apparatus 200 including the electromagnetic wave oscillator 100. Referring to FIG. 3, the electromagnetic wave oscillator 100 includes the lower structure 110 and the upper structure 120 illustrated in FIGS. 1 and 2, respectively. As shown in FIG. 3, the electron beam discharge port 133 and the electromagnetic wave output port 135 are disposed on the right side of the electromagnetic wave oscillator 100. Although not shown in FIG. 3, the electron beam input port 132 would be disposed on the left side of the electromagnetic wave oscillator 100.

The electromagnetic wave oscillator 100 may be used in the electromagnetic wave generating apparatus 200 that generates a millimeter wave, a sub-millimeter wave, or an electromagnetic wave in a terahertz frequency band. Referring to FIG. 3, the electromagnetic wave generating apparatus 200 may include the above-described electromagnetic wave oscillator 100, an electron gun 210, and a collector 220. The electron gun 210 provides an electron beam to the electromagnetic wave oscillator 100. The electron beam emitted from the electron gun 210 may be input into the electromagnetic wave oscillator 100 via the electron beam input port 132. Thereafter, the electron beam may proceed along the electron beam tunnel 131 inside the electromagnetic wave oscillator 100 and may transfer energy to the electromagnetic wave by interaction with the electromagnetic wave resonating in the first waveguide 130. After transferring energy to the electromagnetic wave, the remaining electron beam may be discharged from the electron beam discharge port 133, and the discharged electron beam may be collected by the collector 220. Meanwhile, the terahertz electromagnetic wave amplified by the interaction with the electron beam in the first waveguide 130 may be output to the electromagnetic wave output port 135 via the second waveguide 134. As described above, the electron beam proceeds along the electron beam tunnel 131 that perforates the first waveguide 130, and the electromagnetic wave is generated in the first waveguide 130 and is then amplified in the first waveguide 130 by interaction with the electron beam. Thus, the output electromagnetic wave may be greatly affected by the structure of the first waveguide 130 and the electron beam tunnel 131. In this regard, the structure of the first waveguide 130 and the electron beam tunnel 131 for interaction between the electron beam and the electromagnetic wave may be designed to have an optimum state.

Figure 4A:
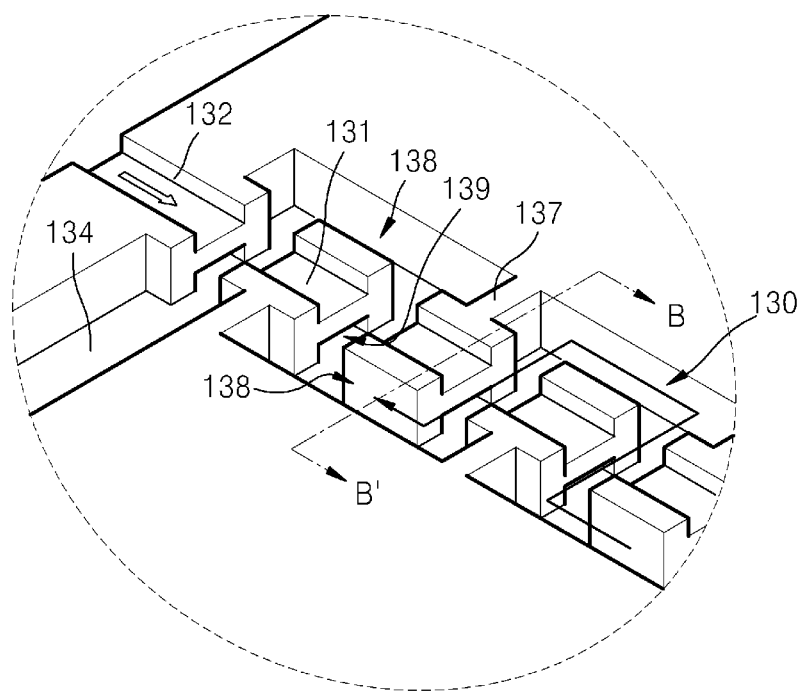
FIG. 4A is a partial enlarged view of a portion A of the lower structure of the electromagnetic wave oscillator illustrated in FIG. 1, which illustrates a structure of a first waveguide and an electron beam tunnel in detail.

FIG. 4A is a partial enlarged view of a portion A of the lower structure 110 of the electromagnetic wave oscillator 100 of FIG. 1, which illustrates an example of a structure of the first waveguide 130 and the electron beam tunnel 131 in detail.

Referring to FIG. 4A, the first waveguide 130 includes a plurality of parallel barrier ribs 137 arranged and aligned in an axial direction (where the axial direction is the same as a direction in which the electron beam proceeds). The plurality of barrier ribs 137 are interdigitated with other adjacent barrier ribs 137. Thus, the electromagnetic wave passes through the first waveguide 130 in a zigzag form, as indicated by a thin arrow of FIG. 4A. In this regard, the first waveguide 130 may considered to be repeatedly folded in a zigzag form a plurality of times. In addition, a space formed between two adjacent barrier ribs 137 extending in the same direction functions as a coupled cavity 138 in which the electromagnetic wave passing through the first waveguide 130 may resonate. That is, the first waveguide 130 is a waveguide having a folded structure, and a coupled cavity 138 is formed in each of the folded portions of the first waveguide 130, respectively. In order to form the coupled cavity 138, the thickness of a portion of the barrier rib 137 in a region where the coupled cavity 138 is to be formed, may be smaller than a thickness of a portion of the barrier rib 137 in another region.

As illustrated in FIG. 4A, the electromagnetic oscillator 100 includes the electron beam tunnel 131 that perforates the first waveguide 130 and is repeatedly folded a plurality of times. Although FIG. 4A illustrates the electron beam tunnel 131 having a shape of a simple groove, the electron beam tunnel 131 may have a complete tunnel shape by combining the lower structure 110 and the upper structure 120, as illustrated in FIG. 3. For example, as illustrated in FIG. 4A, the electron beam tunnel 131 may include a plurality of sections which are formed by the plurality of barriers ribs 137, respectively, and arranged/aligned in the axial direction. One end of the electron beam tunnel 131 is connected to the electron beam input port 132 formed at one side of the electromagnetic wave oscillator 100.

In this structure, the electron beam incident via the electron beam input port 132 proceeds in a straight line in the axial direction along the electron beam tunnel 131, as indicated by a thick arrow of FIG. 4A. In this case, an electromagnetic wave is generated around the electron beam due to the electromagnetic induction phenomenon. The electromagnetic wave generated in this manner proceeds in the zigzag form in the first waveguide 130, as indicated by the thin arrow. That is, the overall proceeding direction of the electromagnetic wave and the proceeding direction of the electron beam are opposite to each other. In this regard, the electromagnetic wave oscillator 100 is a kind of backward wave oscillator. The electromagnetic wave that passes through the first waveguide 130 is resonated in the coupled cavity 138. In addition, due to interaction with the electron beam that perforates the first waveguide 130, the electromagnetic wave obtains energy from the electron beam. In particular, since the first waveguide 130 has the folded structure, the electromagnetic wave passes through the first waveguide 130 in a zigzag form and a proceeding speed of the electromagnetic wave is reduced and the electromagnetic wave may interact with the electron beam more efficiently. In this way, the amplified and oscillated electromagnetic wave may be output to the electromagnetic wave output port 135 via the second waveguide 134.

In addition to the electron beam tunnel 131, as illustrated in FIG. 4A, the electromagnetic wave oscillator 100 may further include an additional auxiliary tunnel 139 formed to perforate the first waveguide 130 in the axial direction. For example, the auxiliary tunnel 139 may be formed to perforate a lower part of the barrier rib 137 on the bottom of the first waveguide 130. Thus, the auxiliary tunnel 139 may be disposed parallel to the electron beam tunnel 131. In one embodiment, the electron beam may be provided only to the electron beam tunnel 131, but the electron beam may also be provided to the auxiliary tunnel 139. The function and effect of the auxiliary tunnel 139 are described below in more detail.

Figure 4B:
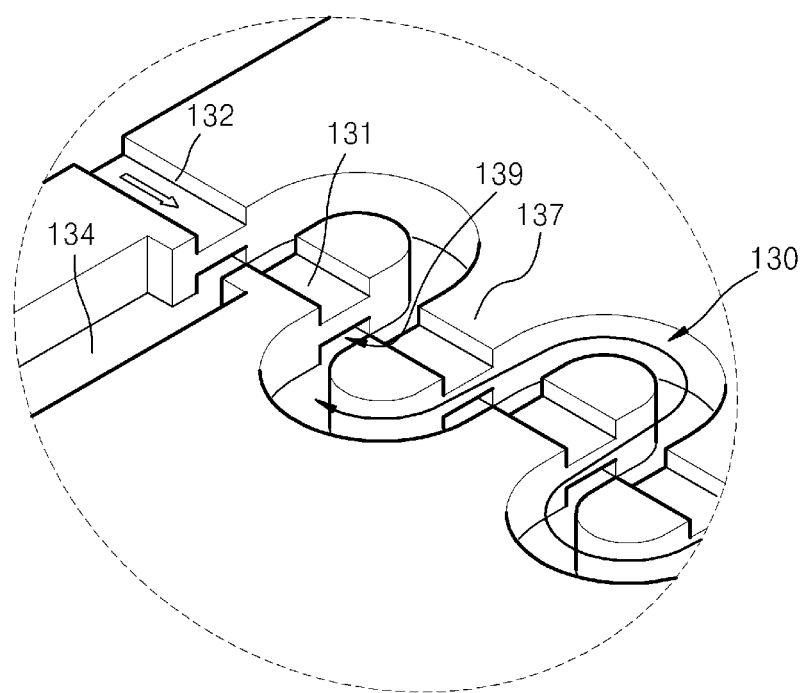
FIG. 4B is a partial enlarged view schematically showing a modified example of the portion A of the lower structure of the electromagnetic wave oscillator of FIG. 1.

In FIG. 4A, the first waveguide 130 having the folded structure includes a plurality of coupled cavities 138. However, a waveguide having a general folded structure that does not include a coupled cavity may also be used. FIG. 4B is a partial enlarged view of the portion A of the lower structure 110, which schematically illustrates the structure of the first waveguide 130, according to another exemplary embodiment. Referring to FIG. 4B, the first waveguide 130 has a structure that is repeatedly folded a plurality of times, but a coupled cavity is not formed in each folded portion. Thus, the barrier rib 137 may have a uniform thickness. In addition, as illustrated in FIG. 4B, the folded portion of the first waveguide 130 may be rounded.

Figure 5A:
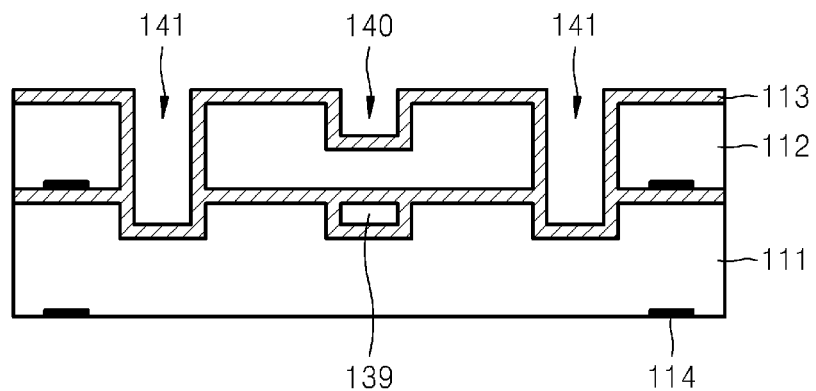
FIG. 5A is a schematic cross-sectional view of a B-B' cross-section of the lower structure illustrated in FIG. 4A.

FIG. 5A is a schematic cross-sectional view of a B-B' cross-section of the lower structure 110 of FIG. 4A in order to illustrate the above-described auxiliary tunnel 139.

Referring to FIG. 5A, the lower structure 110 may include two substrates including a first substrate 111 and a second substrate 112. As illustrated in FIG. 5A, three non-through holes are formed in a top surface of the first substrate 111. In addition, one non-through hole is formed in the center of the top surface of a second substrate 112, and one through hole is formed in both sides of the non-through hole, respectively. Two through holes formed in the second substrate 112 may be formed in positions corresponding to two non-through holes formed in both edges of the first substrate 111. Here, the first substrate 111 and the second substrate 112 may be formed of silicon, for example. In this case, a metal thin layer 113 may be coated on the top surface of the first substrate 111 and inner walls and bottom surfaces of the non-through holes. In addition, the first substrate 111 and the second substrate 112 may be formed of metal having conductivity or another material having conductivity. In this case, the metal thin layer 113 may be omitted.

The lower structure 110 may be formed by bonding the upper surface of the first substrate 111 and the lower surface of the second substrate 112 having the above-described structure. The first and second substrates 111 and 112 may be bonded using various methods without special limitations, for example, silicon (Si) direct bonding, oxide layer bonding, eutectic bonding, or thermo-compressive bonding. In order to precisely align the first substrate 111 and the second substrate 112 when the first and second substrates 111 and 112 are bonded to each other, alignment patterns 114 may be pre-formed on the bottom surface of the first substrate 111 and the bottom surface of the second substrate 112. The lower structure 110 formed by bonding the first substrate 111 and the second substrate 112 in this manner has one first non-through hole 140 having a relatively small depth formed in the center of the top surface of the lower structure 110, and two second non-through holes 141 each having a relatively large depth formed at both sides of the lower structure 110. When the upper structure 120 is bonded to the lower structure 110, the first non-through hole 140 may be the electron beam tunnel 131, and the second non-through holes 141 each may be the coupled cavity 138. The lower structure 110 has one auxiliary tunnel 139 formed between the first substrate 111 and the second substrate 112.

Figure 5B:
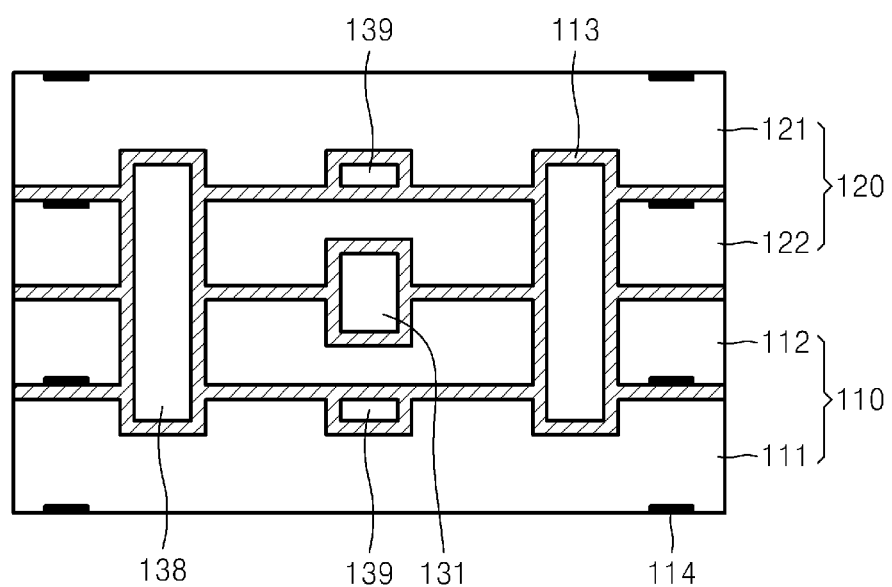
FIG. 5B is a schematic cross-sectional view of a B-B' cross-section of an electromagnetic wave oscillator manufactured by combining the lower structure of FIG. 5A and an upper structure having the same structure as that of the lower structure of FIG. 5A.

FIG. 5B is a schematic cross-sectional view of the electromagnetic wave oscillator 100 configured by bonding the lower structure 110 of FIG. 5A and the upper structure 120 having the same structure as that of the lower structure 110 of FIG. 5A. Referring to FIG. 5B, similar to the lower structure 110, the upper structure 120 may include two substrates, i.e., third and fourth substrates 122 and 121. The third substrate 121 of the upper structure 120 has the same structure as that of the first substrate 111 of the lower structure 110, and the only difference between is a mirror symmetry relationship between the third substrate 121 and the first substrate 111. In addition, the fourth substrate 122 of the upper structure 120 has the same structure as that of the second substrate 112 of the lower structure 110, and the only difference therebetween is a mirror symmetry relationship between the fourth substrate 122 and the second substrate 112.

As illustrated in FIG. 5B, the electromagnetic wave oscillator 100 may be configured by bonding the fourth substrate 122 of the upper structure 120 and the second substrate 112 of the lower structure 110. The electromagnetic wave oscillator 100 may include the electron beam tunnel 131 formed by bonding the first non-through hole 140 of the lower structure 110 and the first non-through hole 140 of the upper structure 120, and the coupled cavity 138 formed by bonding the second non-through holes 141 of the lower structure 110 and the second non-through holes 141 of the upper structure 120. In FIG. 5B, a cross-section of the electron beam tunnel 131 and a cross-section of the coupled cavity 138, i.e., a cross-section of the first waveguide 130, are rectangular. However, this is not limiting. For example, the cross-section of the electron beam tunnel 131 and the cross-section of the coupled cavity 138 may be circular, oval, or polygonal as well as rectangular.

Since FIG. 5B illustrates the B-B' section taken along an edge of the barrier rib 137, the coupled cavity 138 is disposed at both sides of the electron beam tunnel 131, respectively. However, the position of the coupled cavity 138 and the number of coupled cavities 138 may vary according to the position of a cross-section. For example, referring to FIG. 4A, in the case of a cross-section taken along the center of the first barrier rib 138 that is the closest to the electron beam input port 132, the coupled cavity 138 may be disposed only at the right side of the electron beam tunnel 131. In addition, in the case of a cross-section taken along the center of the barrier rib 137 that is disposed the second closest to the electron beam input port 132, the coupled cavity 138 may be disposed only at the left side of the electron beam tunnel 131.

Likewise, in FIG. 5A, one non-through hole is formed in the center of the top surface of the first substrate 111 according to the position of a cross-section, and an additional non-through hole may be formed at at least one of the right and left sides of the non-through hole formed in the center. In addition, one non-through hole is formed in the center of the top surface of the second substrate 112 according to the position of the cross-section, and a through hole may be formed in at least one of the right and left sides of the non-through hole. As a result, one first non-through hole 140 having a relatively small depth formed in the center and a second non-through hole 141 having a relatively large depth formed at at least one of the left and right sides of the first non-through hole 140 may be formed in the top surface of the lower structure 110.

As described in FIG. 4A, the coupled cavity 138 is part of the first waveguide 130 having a folded structure. In addition, the electromagnetic wave oscillator 100 further includes an additional auxiliary tunnel 139 formed on upper and lower portions of the electron beam tunnel 131, respectively. The auxiliary tunnel 139 is formed between the first substrate 111 and the second substrate 112 and between the second substrate 121 and the fourth substrate 122, respectively. Although an electron beam may pass through the auxiliary tunnel 139, the electron beam may be provided only to the electron beam tunnel 139 rather than to the auxiliary tunnel 139. The auxiliary tunnel 139 may be parallel to the electron beam tunnel 131 in the axial direction. FIG. 5B illustrates that the width of the auxiliary tunnel 139 and the width of the electron beam tunnel 131 are the same. However, this is just an example, and the width of the auxiliary tunnel 139 and the width of the electron beam tunnel 131 may vary according to design. In addition, although FIG. 5B illustrates the rectangular cross-section of the auxiliary tunnel 139, aspects of the present invention are not limited thereto. For example, the cross-section of the auxiliary tunnel 139 may be circular, oval, or polygonal as well as rectangular.

The auxiliary tunnel 139 may improve resonant characteristics of the electromagnetic wave in the first waveguide 130, in particular, in the coupled cavity 138. For example, due to the auxiliary tunnel 139, the electromagnetic wave that passes through the first waveguide 130 is effectively condensed on the vicinity of the electron beam tunnel 131 through which the electron beam passes so that interaction between the electron beam and the electromagnetic wave may effectively occur. As a result, the intensity of the electromagnetic wave output from the electromagnetic wave oscillator 100 increases, and the band width of the electromagnetic wave may be increased.

FIGS. 6 through 10 are graphs showing the effect of the additional auxiliary tunnel 139.

Figure 6:
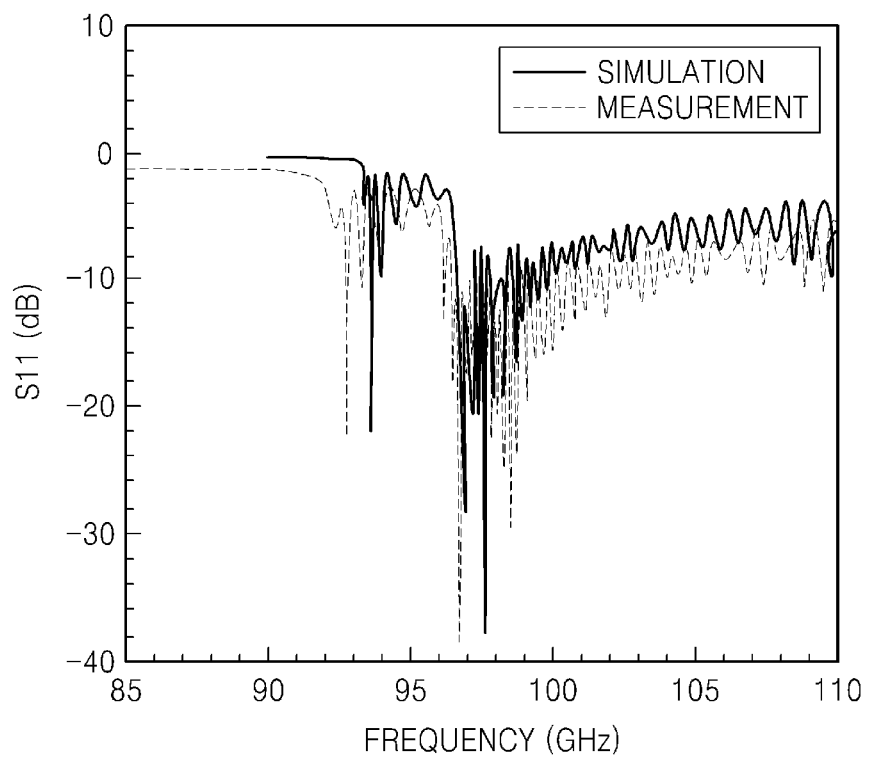
FIG. 6 is a graph showing resonant characteristics of an electromagnetic wave generator having only a single electron beam tunnel.
Figure 7:
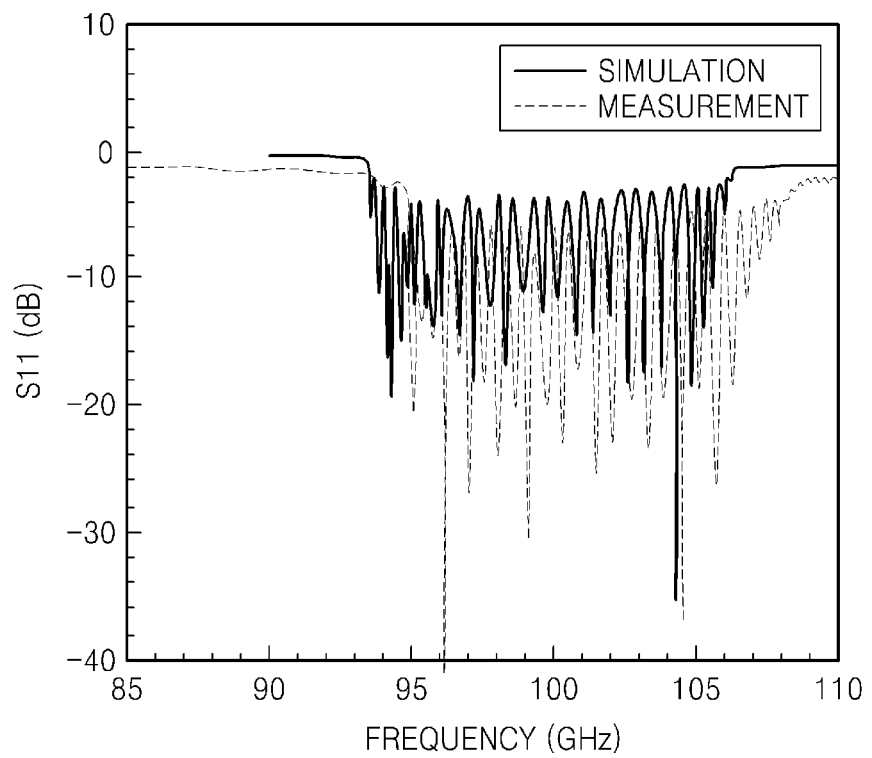
FIG. 7 is a graph showing resonant characteristics of an electromagnetic wave oscillator having a single electron beam tunnel and two auxiliary tunnels.

First, FIG. 6 is a graph showing resonant characteristics of an electromagnetic wave oscillator having only a single electron beam tunnel 131, and FIG. 7 is a graph showing resonant characteristics of an electromagnetic wave oscillator 100 having a single electron beam tunnel 131 and two auxiliary tunnels 139. FIGS. 6 and 7 illustrate return loss characteristics of the electromagnetic wave that is resonated in the first waveguide 130 and is returned, after electromagnetic waves having various frequencies are input to the electromagnetic wave output port 135 of the electromagnetic wave oscillator. Comparing FIGS. 6 and 7, in the electromagnetic wave oscillator 100 having a single electron beam tunnel 131 and two auxiliary tunnels 139, compared to the electromagnetic wave oscillator having only a single electron beam tunnel 131, a resonant band width may further increase, and stronger resonance occurs in the first waveguide 130. In addition, in the case of the electromagnetic wave oscillator 100 having a single electron beam tunnel 131 and two auxiliary tunnels 139, compared to having only a single electron beam tunnel 131, comparatively uniform resonance occurs in a resonant frequency band.

Figure 8:
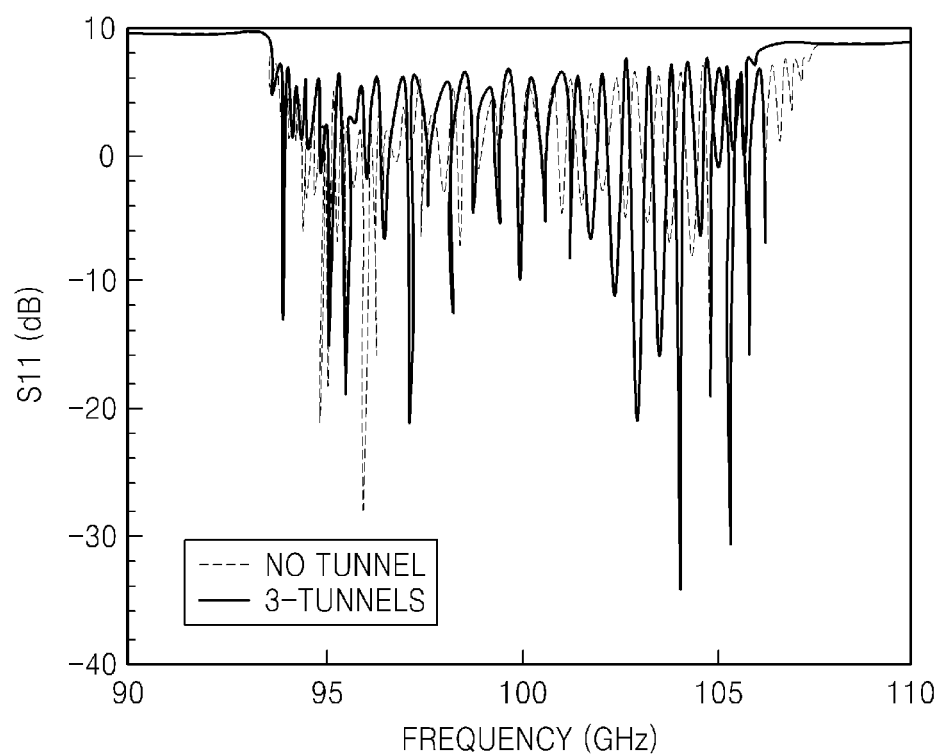
FIG. 8 is a graph showing comparison of resonant characteristics of an electromagnetic wave oscillator when the electromagnetic wave oscillator has no tunnel and when the electromagnetic wave oscillator has three tunnels, respectively.
Figure 9:
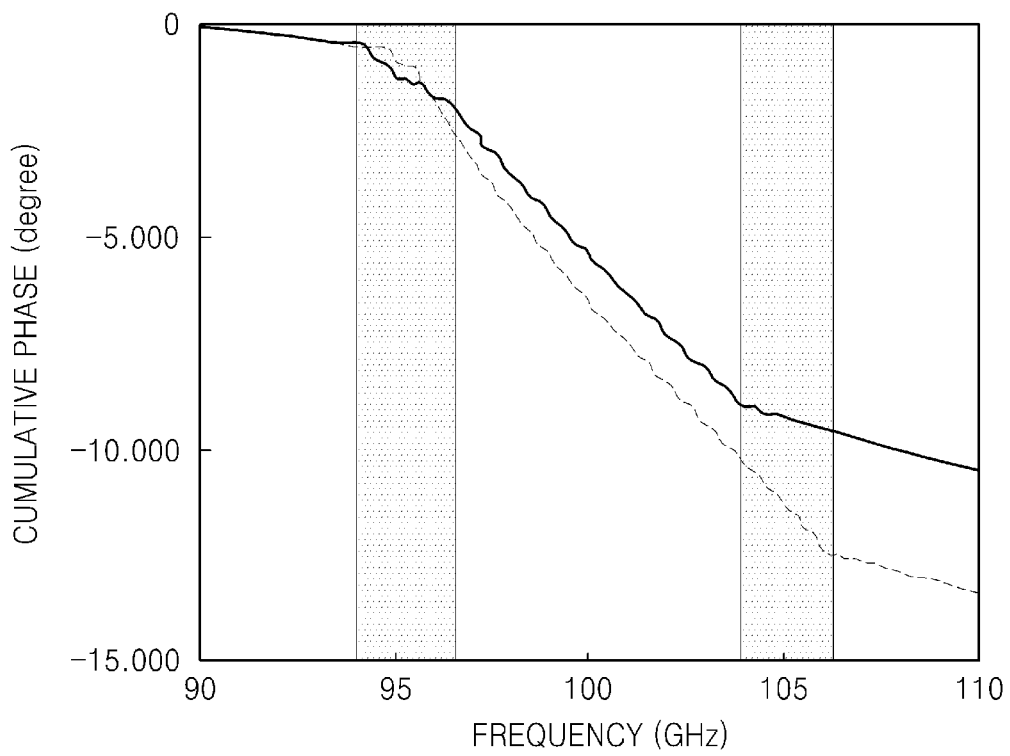
FIG. 9 is a graph showing comparison of phase characteristics of output electromagnetic waves of an electromagnetic wave oscillator when the electromagnetic wave oscillator has no tunnel and when the electromagnetic wave oscillator has three tunnels, respectively.

In addition, FIG. 8 is a graph showing comparison of resonant characteristics of the case where the first waveguide 130 is an idealistic resonator having no tunnel and the case where a single electron beam tunnel 131 and two auxiliary tunnels 139 are disposed in the first waveguide 130. FIG. 9 is a graph showing comparison of phase characteristics of output electromagnetic waves. Referring to FIGS. 8 and 9, the resonant characteristics of the electromagnetic wave oscillator 100 having a single electron beam tunnel 131 and two auxiliary tunnels 139 are very similar to the resonant characteristics of the idealistic resonator.

Figure 10:
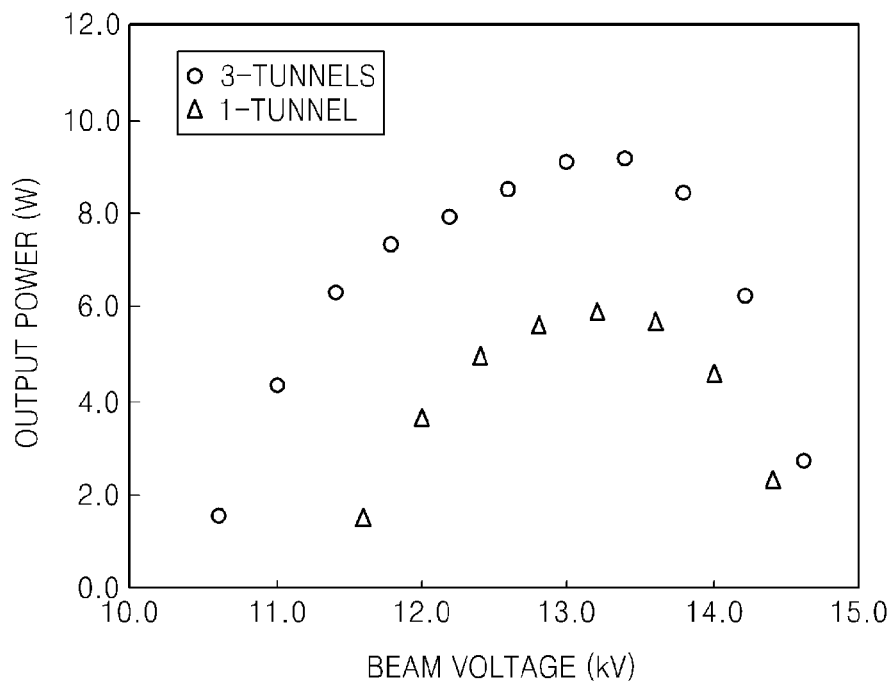
FIG. 10 is a graph showing comparison of intensities of output electromagnetic waves of an electromagnetic wave oscillator when the electromagnetic wave oscillator has no tunnel and when the electromagnetic wave oscillator has three tunnels, respectively.

Last, FIG. 10 is a graph showing comparison of the intensity of an output electromagnetic wave of the electromagnetic wave oscillator having only a single electron beam tunnel 131 and the intensity of an output electromagnetic wave of the electromagnetic wave oscillator 100 having a single electron beam tunnel 131 and two auxiliary tunnels 139. Referring to FIG. 10, the intensity of the output electromagnetic wave may vary according to a voltage of the electron beam that passes through the electron beam tunnel 131. In particular, the intensity (indicated by 'o') of the output electromagnetic wave of the electromagnetic wave oscillator 100 having a single electron beam tunnel 131 and two auxiliary tunnels 139 is much greater than the intensity (indicated by 'Δ') of the output electromagnetic wave of the electromagnetic wave oscillator having only a single electron beam tunnel 131. For example, when the voltage of the electron beam is about 13.0 kV, the intensity of the output electromagnetic wave of the electromagnetic wave oscillator having only a single electron beam tunnel 131 is about 6 W, whereas the intensity of the output electromagnetic wave of the electromagnetic wave oscillator 100 having a single electron beam tunnel 131 and two auxiliary tunnels 139 may be about 9 W.

FIG. 5B illustrates that one auxiliary tunnel 139 is disposed at upper and lower sides of the electron beam tunnel 131, respectively. However, the number of auxiliary tunnels 139 and the position of the auxiliary tunnel 139 may be modified according to design. FIGS. 11A through 11G are schematic cross-sectional views of various arrangement examples of the auxiliary tunnels 139 disposed around the electron beam tunnel 131. In FIGS. 11A through 11G, for convenience of explanation, the metal thin layer 113 and the alignment patterns 114 are omitted. In addition, although in FIGS. 11A through 11G, for convenience of explanation, the coupled cavity 138 is formed at both sides of the electron beam tunnel 131, as described above, the coupled cavity 138 may be formed at one of the left and right sides of the electron beam tunnel 131 according to the position of the cross-section. Hereinafter, FIGS. 11A through 11G will be described as illustrating the B-B' section of FIG. 4A.

Figure 11A:
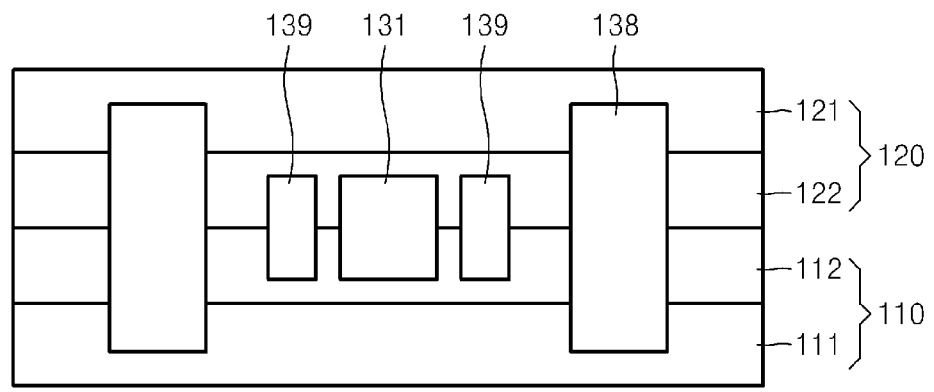
FIGS. 11A through 11G are cross-sectional views of various arrangement examples of auxiliary tunnels formed around an electron beam tunnel.
Figure 11B:
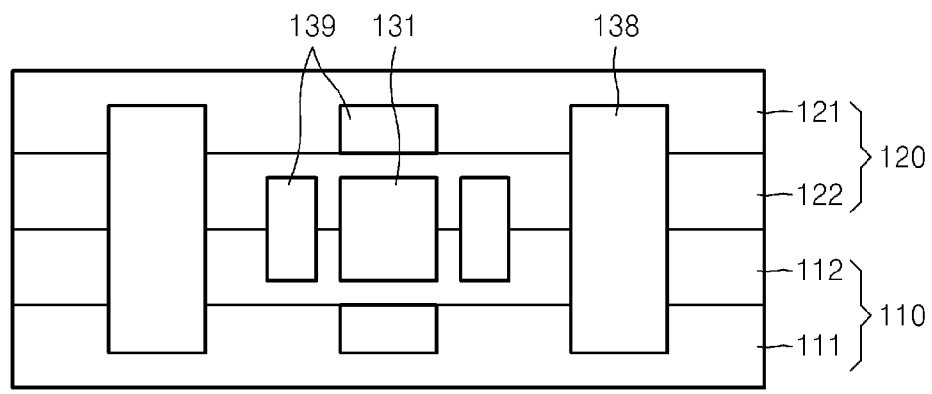

First, as illustrated in FIG. 11A, one auxiliary tunnel 139 may be disposed at the right and left sides of the electron beam tunnel 131, respectively. For example, the auxiliary tunnel 139 may be disposed between the electron beam tunnel 131 and the coupled cavity 138. In FIG. 11A, the height of the auxiliary tunnel 139 is the same as the height of the electron beam tunnel 131. However, the height of the auxiliary tunnel 139 may be different from the height of the electron beam tunnel 131. In addition, as illustrated in FIG. 11B, the electromagnetic wave oscillator 100 may include four auxiliary tunnels 139, of which one is disposed at upper and lower portions and at right and left sides of the electron beam tunnel 131, respectively. However, the auxiliary tunnel 139 does not need to be disposed symmetrically with respect to the electron beam tunnel 131. For example, the auxiliary tunnel 139 may be disposed at one of the upper and lower portions of the electron beam tunnel 131, or at one of the right and left sides of the electron beam tunnel 131. If the auxiliary tunnel 139 is disposed at one of the upper and lower portions of the electron beam tunnel 131, the auxiliary tunnel 139 may be formed at only one of the lower structure 110 and the upper structure 120. In more detail, the auxiliary tunnel 139 may be formed on only one of the first substrate 111 and the third substrate 121.

Figure 11C:
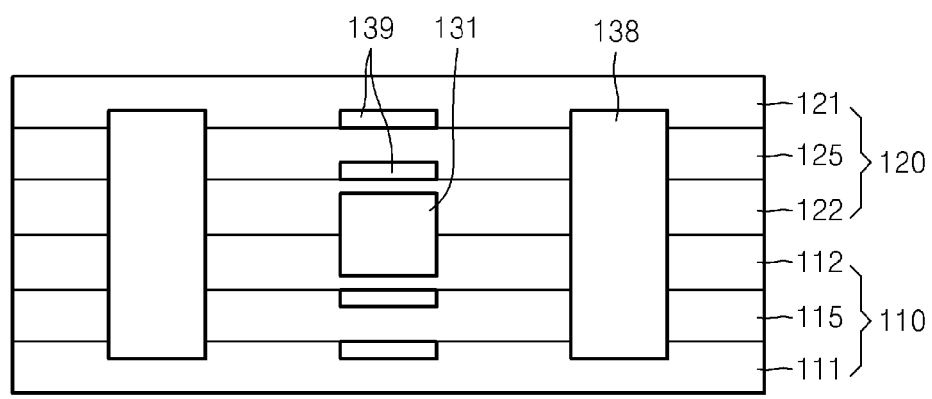

In addition, referring to FIG. 11C, a total of four auxiliary tunnels 139 may be disposed, i.e., two auxiliary tunnels 139 may be disposed at the upper portion and two auxiliary tunnels 139 at the lower portion of the electron beam tunnel 131. In this case, the lower structure 110 and the upper structure 120 of the electromagnetic wave generator 100 each may include three substrates. For example, the lower structure 110 may further include a fifth substrate 115 disposed between the first substrate 111 and the second substrate 112. One non-through hole is formed in the top surface of the fifth substrate 115, and one through hole is formed in both sides of the non-through hole, respectively. Two through holes of the fifth substrate 115 may be formed in positions corresponding to two non-through holes formed in both edges of the first substrate 111. The upper structure 120 may further include a sixth substrate 125 disposed between the third substrate 121 and the fourth substrate 122. The sixth substrate 125 has the same structure as that of the fifth substrate 115, and the only difference therebetween is a mirror symmetry relationship between the sixth substrate 125 and the fifth substrate 115. By bonding the lower structure 110 and the upper structure 120 having the above structure, as described above, each of the electron beam tunnel 131 and the coupled cavity 138 may be disposed. The auxiliary tunnel 139 may be disposed between the first substrate 111 and the fifth substrate 115, between the fifth substrate 115 and the second substrate 113, between the third substrate 121 and the sixth substrate 125, and the sixth substrate 125 and the fourth substrate 122, respectively.

Figure 11D:
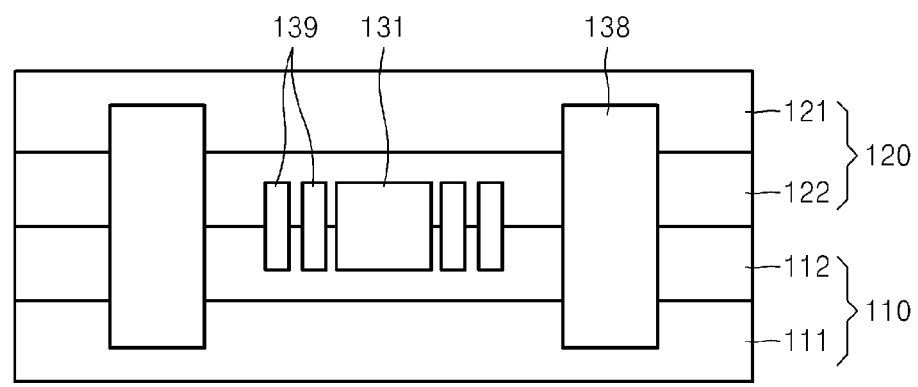
Figure 11E:
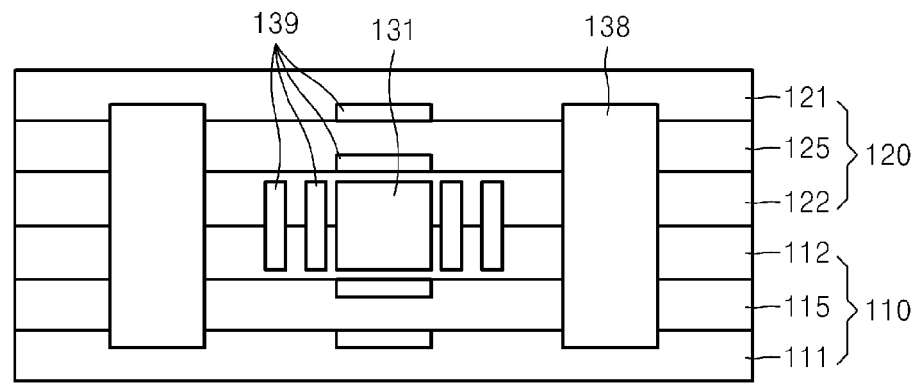

Referring to FIG. 11D, a total of four auxiliary tunnels 139 may be disposed, i.e., two auxiliary tunnels 139 may be disposed at the right side and two auxiliary tunnels 139 at the left side of the electron beam tunnel 131. In this case, the lower structure 100 and the upper structure 120 of the electromagnetic wave oscillator 100 each may include two substrates. In addition, as illustrated in FIG. 11E, the electromagnetic wave oscillator 100 may include a total of eight auxiliary tunnels 139, i.e., two auxiliary tunnels 139 may be disposed on the upper portion and two auxiliary tunnels 139 on the lower portion, and two auxiliary tunnels 139 may be disposed at the right and left sides of the electron beam tunnel 131, respectively. In this case, as illustrated in FIG. 11D, each of the lower structure 110 and the upper structure 120 may include three substrates.

Figure 11F:
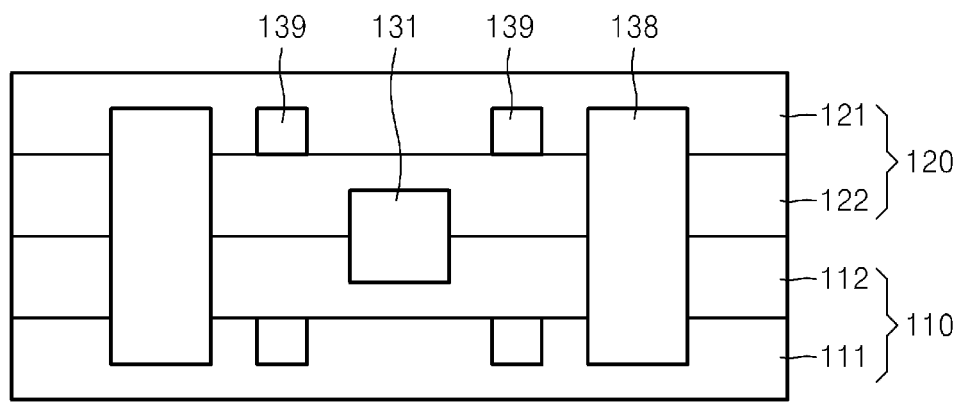
Figure 11G:
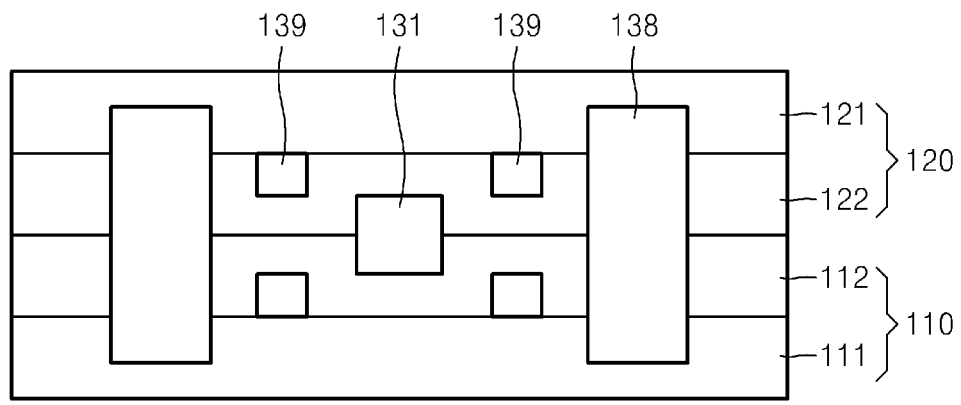

FIG. 11F illustrates the case that two auxiliary tunnels 139 are disposed on the upper and lower portions of the electron beam tunnel 131, wherein two auxiliary tunnels 139 disposed on the upper portion of the electron beam tunnel 131 are adjacent to each other at the same height, and two auxiliary tunnels 139 disposed on the lower portion of the electron beam tunnel 131 are adjacent to each other at the same height. In FIG. 11F, the auxiliary tunnels 139 may be formed by etching the surface of the first substrate 111 and the surface of the third substrate 121. In addition, as illustrated in FIG. 11G, the auxiliary tunnels 139 may also be formed by etching the bottom surface of the second substrate 112 and the bottom surface of the fourth substrate 122, i.e., the opposite surface to a surface in which a non-through hole is formed. In FIG. 11G, the electromagnetic wave oscillator 100 may include auxiliary tunnels 139 formed with different heights at the right and left sides of the electron beam tunnel 131. As illustrated in FIGS. 11A through 11F, the auxiliary tunnels 139 may be formed in various positions of the electron beam tunnel 131, and the lower structure 110 and the upper structure 120 of the electromagnetic wave oscillator 100 may include two, three, or more substrates according to positions and the number of auxiliary tunnels 139.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. An electromagnetic wave oscillator comprising:
   a first waveguide which has a folded structure such that a path traveled by an electromagnetic wave through the first waveguide crosses an axial direction a plurality of times;
   an electron beam tunnel through which an electron beam passes, wherein the electron beam tunnel extends along the axial direction; and
   at least one auxiliary tunnel which extends parallel to the electron beam tunnel; and a second waveguide comprising a first end connected to the first waveguide and a second end comprising an electromagnetic wave output port,
wherein the first waveguide includes a plurality of parallel barrier ribs arranged along the axial direction, each barrier rib of the plurality of barrier ribs being interdigitated with other adjacent barrier ribs of the plurality of barrier ribs such that the plurality of barrier ribs are alternately disposed in opposite directions, and
wherein the second waveguide has a tapered structure in which a width of the second waveguide increases from the first end to the second end thereof.

2. The electromagnetic wave oscillator of claim 1, wherein the at least one auxiliary tunnel is disposed one of above and below the electron beam tunnel.

3. The electromagnetic wave oscillator of claim 1, wherein the at least one auxiliary tunnel is disposed one of at a left side and a right side of the electron beam tunnel.

4. The electromagnetic wave oscillator of claim 1, wherein the at least one auxiliary tunnel is disposed one of above and below the electron beam tunnel and one of at a left side and a right side of the electron beam tunnel.

5. The electromagnetic wave oscillator of claim 1, wherein the at least one auxiliary tunnel comprises at least two auxiliary tunnels both disposed one of above and below the electron beam tunnel, wherein the at least two auxiliary tunnels are adjacent to each other at the same height relative to the electron beam tunnel.

6. The electromagnetic wave oscillator of claim 1, wherein the at least one auxiliary tunnel comprises at least two auxiliary tunnels both disposed one of at a left side and a right side of the electron beam tunnel, wherein the at least two auxiliary tunnels are adjacent to each other at different heights.

7. The electromagnetic wave oscillator of claim 1, wherein the folded structure of the first waveguide comprises a plurality of coupled cavities disposed at left and right sides of the electron beam tunnel.

8. The electromagnetic wave oscillator of claim 7, wherein the at least one auxiliary tunnel is disposed one of:
between a left side of the electron beam tunnel and a plurality of the coupled cavities disposed to the left of the electron beam tunnel, and
between a right side of the electron beam tunnel and a plurality of the coupled cavities disposed to the right of the electron beam tunnel.

9. The electromagnetic wave oscillator of claim 7, wherein:
the at least one auxiliary tunnel is disposed one of above and below the electron beam tunnel, and
the at least one auxiliary tunnel is disposed one of:
between a left side of the electron beam tunnel and a plurality of the coupled cavities disposed to the left of the electron beam tunnel, and
between a right side of the electron beam tunnel and a plurality of the coupled cavities disposed to the right of the electron beam tunnel.

10. The electromagnetic wave oscillator of claim 7, wherein the at least one auxiliary tunnel comprises at least two auxiliary tunnels both disposed one of:
between a left side of the electron beam tunnel and a plurality of the coupled cavities disposed to the left of the electron tunnel, and
between a right side of the electron beam tunnel and a plurality of the coupled cavities disposed to the right of the electron tunnel,
wherein the at least two auxiliary tunnels are adjacent to each other at different heights.

11. An electromagnetic wave oscillator comprising:
a first waveguide which has a folded structure such that a path traveled by an electromagnetic wave through the first waveguide crosses an axial direction a plurality of times;
an electron beam tunnel through which an electron beam passes, wherein the electron beam tunnel extends along the axial direction;
at least one auxiliary tunnel which extends parallel to the electron beam tunnel;
a second waveguide comprising a first end connected to the first waveguide and a second end comprising an electromagnetic wave output port;
an electron beam input port which is connected to the first end of the electron beam tunnel and on which the electron beam is incident; and
an electron beam discharge port which is connected to the second end of the electron beam tunnel and from which the electron beam is discharged,
wherein the second waveguide comprises a bend of about 90 degrees and has a tapered structure in which a width of the second waveguide increases from the first end to the second end thereof.

12. The electromagnetic wave oscillator of claim 1, further comprising:
a lower structure having an upper surface; and
an upper structure having a lower surface bonded to the upper surface of the lower structure,
wherein the first waveguide and the electron beam tunnel are formed between the upper surface of the lower structure and the lower surface of the upper structure, and
the at least one auxiliary tunnel is disposed in at least one of the lower structure and the upper structure.

13. The electromagnetic wave oscillator of claim 12, wherein the lower structure comprises:
a first substrate comprising a first hole which does not extend entirely through the first substrate and a second hole which does not extend entirely through the first substrate, wherein the second hole is disposed one of at a left side of the first hole and at a right side of the first hole; and
a second substrate comprising a first hole which does not extend entirely through the second substrate and a second hole which extends entirely through the second substrate, wherein the second hole of the second substrate is formed in a position corresponding to a position of the second hole of the first substrate.

14. The electromagnetic wave oscillator of claim 13, wherein the upper structure comprises:
a third substrate comprising a first hole which does not extend entirely through the third substrate and a second hole which does not extend entirely through the third substrate, wherein the second hole is disposed one of at a left side of the first hole and at a right side of the first hole; and
a fourth substrate comprising a first hole which does not extend entirely through the fourth substrate and a second hole which extends entirely through the fourth substrate,
wherein the second hole of the fourth substrate is formed in a position corresponding to a position of the second hole of the third substrate.

15. The electromagnetic wave oscillator of claim 14, wherein the second substrate and the fourth substrate are bonded to each other, and the electron beam tunnel is formed by the first hole of the second substrate and the first hole of the fourth substrate.

16. The electromagnetic wave oscillator of claim 15, wherein the first waveguide is formed by the second hole of the first substrate, the second hole of the second substrate, the second hole of the fourth substrate, and the second hole of the third substrate.

17. The electromagnetic wave oscillator of claim 15, wherein the at least one auxiliary tunnel comprises an auxiliary tunnel formed by the first hole of the first substrate and an auxiliary tunnel formed by the first hole of the third substrate, respectively.

18. The electromagnetic wave oscillator of claim 15, wherein the lower structure further comprises a fifth substrate interposed between the first substrate and the second substrate, wherein the fifth substrate comprises and comprising a first hole which does not extend entirely through the fifth substrate and a second hole which extends entirely through the fifth substrate, wherein the second hole is disposed one of at a left side of the first hole and at a right side of the first hole.

19. The electromagnetic wave oscillator of claim 18, wherein the upper structure further comprises a sixth substrate interposed between the third substrate and the fourth substrate, wherein the sixth substrate comprises a first hole which does not extend entirely through the sixth substrate and a second hole which extends entirely through the sixth substrate, wherein the second hole is disposed one of at a left side of the first hole and at a right side of the first hole.

20. The electromagnetic wave oscillator of claim 19, wherein the at least one auxiliary tunnel comprises an auxiliary tunnel formed by the first hole of the fifth substrate and an auxiliary tunnel formed by the first hole of the sixth substrate.

21. The electromagnetic wave oscillator of claim 19, further comprising a metal thin layer coated on the first substrate, the second substrate, the third substrate, the fourth substrate, the fifth substrate and the sixth substrate.

22. An electromagnetic wave generating apparatus comprising:
an electromagnetic wave oscillator which generates an electromagnetic wave;
an electron gun which supplies an electron beam to the electromagnetic wave oscillator; and
a collector which collects the electron beam discharged from the electromagnetic wave oscillator,
wherein the electromagnetic wave oscillator comprises:
a first waveguide which has a folded structure such that a path traveled by an electromagnetic wave through the first waveguide crosses an axial direction a plurality of times;
an electron beam tunnel through which an electron beam passes, wherein the electron beam tunnel extends along the axial direction; and
at least one auxiliary tunnel which extends parallel to the electron beam tunnel,
wherein the electromagnetic wave oscillator is configured to cause one of a millimeter wave, a sub-millimeter wave, and an electromagnetic wave in a terahertz frequency band passing through the first waveguide to obtain energy by interaction with the electron beam that passes through the electron beam tunnel.

23. An electromagnetic wave oscillator comprising:
a waveguide which extends in a wave-like shape from a first end to a second end, such that the waveguide crosses an axial direction a plurality of times, wherein the axial direction is a direction from the first end to the second end;
an electron beam tunnel which guides an electron beam, wherein the electron bean tunnel extends parallel to the axial direction; and
an auxiliary tunnel which extends parallel to the axial direction,
wherein the waveguide includes a plurality of parallel barrier ribs arranged along the axial direction, each barrier rib of the plurality of barrier ribs being interdigitated with other adjacent barrier ribs of the plurality of barrier ribs such that the plurality of barrier ribs are alternately disposed in opposite directions, and
wherein the electron beam tunnel and the auxiliary tunnel perforate the plurality of parallel barrier ribs of the waveguide,
wherein the thickness of first portions of the barrier ribs is smaller than a thickness of second portions of the barrier ribs such that a coupled cavity is formed between the first portions of two adjacent barrier ribs extending in the same direction, and wherein the electron beam tunnel and the auxiliary tunnel perforate the second portions of the barrier ribs.

24. The electromagnetic wave oscillator of claim 1, wherein the thickness of first portions of the barrier ribs is smaller than a thickness of second portions of the barrier ribs such that a coupled cavity is formed between the first portions of two adjacent barrier ribs extending in the same direction, and wherein the electron beam tunnel and the auxiliary tunnel perforate the second portions of the barrier ribs.

25. The electromagnetic wave oscillator of claim 11, wherein the first waveguide includes a plurality of parallel barrier ribs arranged along the axial direction, each barrier rib of the plurality of barrier ribs being interdigitated with other adjacent barrier ribs of the plurality of barrier ribs such that the plurality of barrier ribs are alternately disposed in opposite directions, and
wherein the electron beam tunnel and the at least one auxiliary tunnel perforate the plurality of parallel barrier ribs of the first waveguide.

26. The electromagnetic wave generating apparatus of claim 22, wherein the first waveguide includes a plurality of parallel barrier ribs arranged along the axial direction, each barrier rib of the plurality of barrier ribs being interdigitated with other adjacent barrier ribs of the plurality of barrier ribs such that the plurality of barrier ribs are alternately disposed in opposite directions, and
wherein the electron beam tunnel and the at least one auxiliary tunnel perforate the plurality of parallel barrier ribs of the first waveguide.

* * * * *